US012279372B2

(12) United States Patent
Salkovic et al.

(10) Patent No.: US 12,279,372 B2
(45) Date of Patent: Apr. 15, 2025

(54) COMPONENT CARRIER WITH A MAGNETIC ELEMENT AND A MANUFACTURING METHOD

(71) Applicant: AT&S Austria Technologie & Systemtechnik Aktiengesellschaft, Leoben (AT)

(72) Inventors: Ivan Salkovic, Zagreb (HR); Vanesa López Blanco, Vimianzo (ES)

(73) Assignee: AT&S Austria Technologie &Systemtechnik Aktiengesellschaft, Leoben (AT)

( * ) Notice: Subject to any disclaimer, the term of this patent is extended or adjusted under 35 U.S.C. 154(b) by 0 days.

(21) Appl. No.: 17/663,418

(22) Filed: May 13, 2022

(65) Prior Publication Data

US 2022/0377896 A1    Nov. 24, 2022

(30) Foreign Application Priority Data

May 18, 2021  (EP) ..................................... 21174488

(51) Int. Cl.
*H05K 1/02* (2006.01)
*H01F 17/00* (2006.01)
(Continued)

(52) U.S. Cl.
CPC ......... *H05K 1/165* (2013.01); *H01F 17/0006* (2013.01); *H05K 1/09* (2013.01);
(Continued)

(58) Field of Classification Search
CPC ............ H05K 1/02; H05K 1/09; H05K 1/165; H05K 1/185; H05K 3/1216;
(Continued)

(56) References Cited

U.S. PATENT DOCUMENTS 6,296,955 B1 *  10/2001  Hossain ............... G11B 5/3133
                                                    360/122
2006/0152321 A1 *  7/2006  Jung ................... H01F 17/0006
                                                    336/200
(Continued)

FOREIGN PATENT DOCUMENTS

DE    102014209881 A1   11/2015
EP      1 365 451 A1    11/2002
TW       201311079 A     3/2013

OTHER PUBLICATIONS

Decocinck, E.; Extended European Search Report in Application No. 21174488.3; pp. 1-8; Oct. 29, 2021; European Patent Office; 80298 Munich, Germany.

*Primary Examiner* — Xiaoliang Chen
(74) *Attorney, Agent, or Firm* — Robert A. Blaha; Smith Tempel Blaha LLC

(57) ABSTRACT

A component carrier includes a stack including at least one electrically conductive layer structure and/or at least one electrically insulating layer structure, a magnetic element assembled to the stack, and a dielectric layer structure on the stack. The magnetic element includes an embedded inductive element. The dielectric layer structure at least partially surrounds the magnetic element. Further, a manufacturing method and a use of photo-imaging are described.

8 Claims, 3 Drawing Sheets

(51) Int. Cl.
*H01F 17/06* (2006.01)
*H01F 27/26* (2006.01)
*H01F 27/40* (2006.01)
*H05K 1/09* (2006.01)
*H05K 1/16* (2006.01)
*H05K 3/12* (2006.01)

(52) U.S. Cl.
CPC ... *H05K 3/1216* (2013.01); *H05K 2201/0358* (2013.01); *H05K 2201/0376* (2013.01); *H05K 2203/308* (2013.01)

(58) Field of Classification Search
CPC ... H05K 2201/0358; H05K 2201/0376; H05K 2203/308; H01F 17/0006; H01F 17/0013; H01F 17/06; H01F 27/26; H01F 27/40; H01F 27/292; H01F 27/323; H01F 27/327; H01F 27/2804; H01F 27/2828; H01F 41/041; H01F 41/042; H01F 41/046; H01L 21/486; H01L 21/565; H01L 21/4857; H01L 21/4867; H01L 23/645; H01L 23/3128; H01L 23/5227; H01L 23/5383; H01L 23/5386; H01L 23/5389; H01L 23/49822
USPC ..... 361/748; 336/200, 221; 360/119.04, 319
See application file for complete search history.

(56) References Cited

U.S. PATENT DOCUMENTS

| | | | |
|---|---|---|---|
| 2009/0256236 A1* | 10/2009 | Smeys | B81B 3/0072 257/E21.022 |
| 2009/0256667 A1* | 10/2009 | Smeys | H01F 17/0006 257/E21.022 |
| 2010/0033879 A1* | 2/2010 | Ota | G11B 5/312 |
| 2011/0157746 A1* | 6/2011 | Hirata | G11B 5/1278 360/119.04 |
| 2012/0280781 A1* | 11/2012 | Smeys | H01F 17/0033 336/219 |
| 2013/0342301 A1* | 12/2013 | Mano | H01F 41/041 336/200 |
| 2014/0240075 A1* | 8/2014 | Yang | H01F 17/0013 427/116 |
| 2017/0092412 A1* | 3/2017 | Manusharow | H01F 27/24 |
| 2019/0198228 A1* | 6/2019 | Vadlamani | H01L 23/5383 |
| 2019/0198436 A1* | 6/2019 | Vadlamani | H05K 1/00 |
| 2019/0295951 A1 | 9/2019 | Darmawikarta et al. | |
| 2019/0304661 A1* | 10/2019 | Xu | H01F 17/0006 |
| 2020/0005994 A1* | 1/2020 | Lee | H01L 28/10 |
| 2021/0005377 A1* | 1/2021 | Suzuki | H01F 41/042 |
| 2021/0098371 A1* | 4/2021 | Hsu | H01L 28/10 |
| 2021/0104354 A1* | 4/2021 | Yoshioka | H01F 41/041 |
| 2021/0391284 A1* | 12/2021 | Hsu | H01L 23/5383 |
| 2022/0037458 A1* | 2/2022 | Chou | H01F 17/06 |
| 2022/0093537 A1* | 3/2022 | Radhakrishnan | H01F 27/323 |
| 2022/0285079 A1* | 9/2022 | Pietambaram | H01F 27/40 |
| 2022/0293327 A1* | 9/2022 | Ganesan | H01F 27/40 |

* cited by examiner

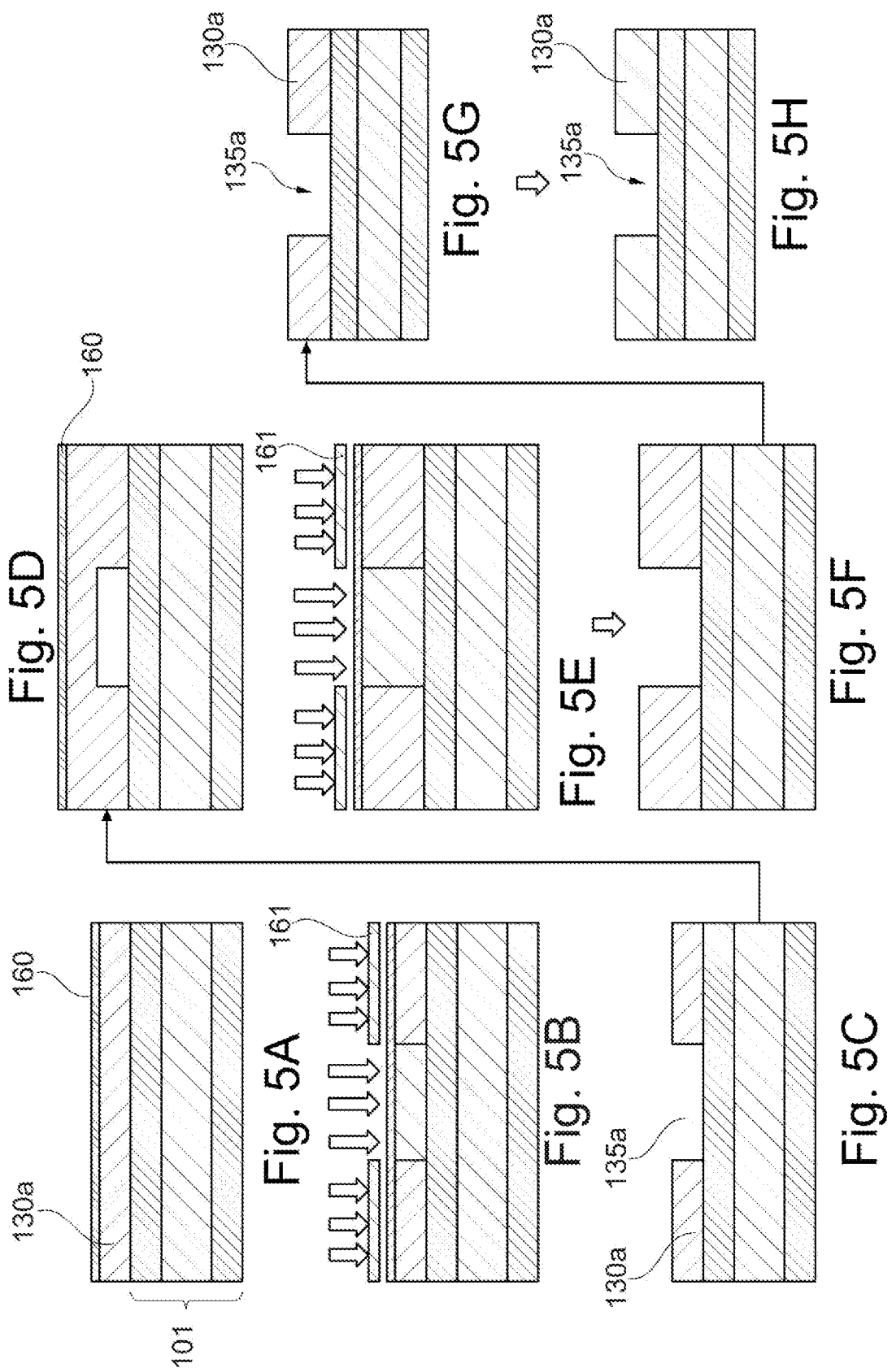

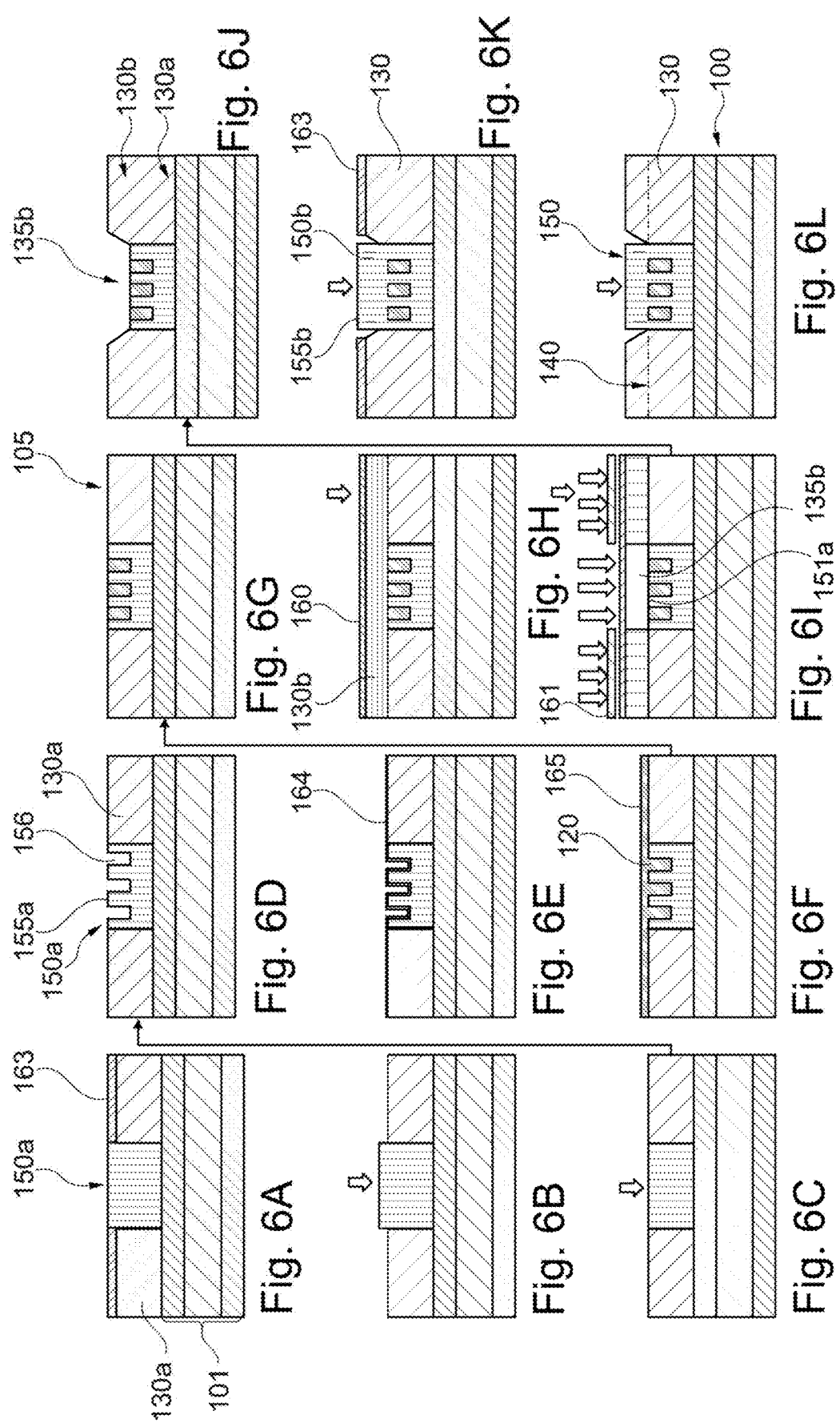

COMPONENT CARRIER WITH A MAGNETIC ELEMENT AND A MANUFACTURING METHOD

CROSS-REFERENCE TO RELATED APPLICATIONS

This application claims the benefit of the filing date of European Patent Application No. 21174488.3, filed May 18, 2021, the disclosure of which is hereby incorporated herein by reference.

TECHNICAL FIELD

Embodiments of the present invention relate to a component carrier, a method of manufacturing a component carrier, and a method of using photo-imaging.

TECHNOLOGICAL BACKGROUND

In the context of growing product functionalities of component carriers equipped with one or more electronic components and increasing miniaturization of such electronic components as well as a rising number of electronic components to be mounted on the component carriers such as printed circuit boards, increasingly more powerful array-like components or packages having several electronic components are being employed, which have a plurality of contacts or connections, with ever smaller spacing between these contacts. Removal of heat generated by such electronic components and the component carrier itself during operation becomes an increasing issue. Also, an efficient protection against electromagnetic interference (EMI) becomes an increasing issue. At the same time, component carriers shall be mechanically robust and electrically and magnetically reliable so as to be operable even under harsh conditions.

Moreover, an extended functionality of component carriers is demanded by users. For example, it is known to integrate magnetic material in a component carrier in order to provide/enhance an inductance for specific applications. However, conventional approaches may suffer from low inductance values and high production efforts/costs.

However, assembling magnetic material to a circuit board may be considered cumbersome and cost inefficient. On the one hand, the amount of magnetic material is generally low in this design and accordingly, only small (and few) magnetic particles can be used which leads in turn to low inductance values.

FIG. 2 shows a conventional example, wherein a magnetic element is surface-mounted to a circuit board 400.

SUMMARY

There may be a need to provide a large magnetically enhanced inductance for a component carrier in a cost-efficient manner.

A component carrier, a method of manufacturing, and a use according to the independent claims are provided.

According to an aspect of the disclosure a component carrier is described, comprising:
  i) a (layer) stack comprising at least one electrically conductive layer structure and/or at least one electrically insulating layer structure,
  ii) a magnetic element (e.g., a magnetic paste) assembled (e.g., surface mounted or partially embedded) to the stack, in particular wherein the magnetic element comprises an embedded inductive element (e.g., a coil), and
  iii) a dielectric layer structure (e.g., a photo-imageable dielectric (PID) such as a non-fiber enforced resin) on (in particular directly on) the stack, wherein the dielectric layer structure at least partially (in particular fully) surrounds (encapsulates) the magnetic element (in particular, wherein the dielectric layer structure comprises a cavity and the magnetic element is at least partially embedded in said cavity, more in particular wherein the cavity is formed by one of photo-imaging, etching, pre-cutting).

According to a further aspect of the disclosure, a method of manufacturing a component carrier is described, the method comprising:
  i) providing a stack comprising at least one electrically conductive layer structure and/or at least one electrically insulating layer structure (using PCB technology),
  ii) arranging, in particular laminating, a first dielectric layer structure on the stack,
  iii) forming a first cavity within the first dielectric layer structure (e.g., using photo-imaging such as photolithography),
  iv) placing a first magnetic element at least partially into the first cavity, so that the first dielectric layer structure at least partially surrounds the first magnetic element,
  v) arranging, in particular laminating, a second dielectric layer structure on the first dielectric layer structure and the first magnetic element,
  vi) forming a second cavity within the second dielectric layer structure, and
  vii) placing a second magnetic element at least partially into the second cavity (and on the first magnetic element), so that the second dielectric layer structure at least partially surrounds the second magnetic element.

According to a further aspect of the disclosure, it is described a use (method of using) of photo-imaging (in particular photolithography) of a dielectric layer structure to provide cavities in order to embed an inductive element (e.g., a coil) comprising a magnetic element in a component carrier (in an (essentially) drill-free manner).

Overview of Embodiments

In the context of the present document, the term "magnetic element" may refer to any element suitable to be incorporated into a component carrier (such as a circuit board) and which element comprises magnetic properties. The magnetic element may comprise any shape according to the desired functionality, e.g., rectangular (in particular in form of a block), circular, polygonal, etc. A magnetic element may comprise a magnetic matrix (see definition below) into which an inductive element may be placed/embedded. In a specific example, a magnetic element may comprise a magnetic paste. In a preferred example, the magnetic element is arranged in the component carrier in a planar manner (with the directions of main extension being parallel to the component carrier directions of main extension, in other words: arranged horizontally).

The magnetic element may be essentially shaped as a plate and/or planar, meaning that it comprises two directions of main extension along the x- and y-axes (with respect to the component carrier) and a comparably short extension along the z-axis. In this context, the term "horizontal" may thus mean "oriented in parallel with a direction of main extension", while the term "vertical" may mean "oriented perpendicular to the directions of main extension". Hence, even if the component carrier is turned around, the terms "vertical" and "horizontal" always have the same meaning.

In the context of the present document, the term "magnetic matrix" may in particular refer to a base material (base substance) that comprises magnetic properties. The base material may be magnetic itself or magnetic particles may be distributed within a non-magnetic matrix material. The magnetic matrix may be configured for example rigid/solid (e.g., as magnetic sheets) or viscous (magnetic paste). The magnetic matrix may comprise electrically conductive material/particles and/or electrically insulating material/particles. Further, the magnetic matrix may be configured to have a relative magnetic permeability $\mu_r$ in a range from 2 to $10^6$. A plurality of different materials may be considered suitable to provide the base material and/or the embedded particles of the magnetic matrix, for example a ferromagnetic material (like iron), a ferrimagnetic material (like ferrite), a permanent magnetic material, a soft magnetic material, a metal oxide. In an example, a dielectric (resin) matrix with magnetic particles therein is used. In another example, magnetic sheets are applied that comprise magnetic particles embedded in a fiber-enforced resin (e.g., prepreg). In a further example, a magnetic paste is used that comprises magnetic particles embedded in a not fiber-enforced resin.

In the context of the present document, the term "dielectric layer structure" may refer to any dielectric material that can be formed (in particular laminated) as a component carrier layer structure. Further, a cavity may be formed in the dielectric layer structure, in particular by using one of photo-imaging, etching, pre-cutting.

In the context of the present document, the term "photo-imageable dielectric layer structure" may refer to any dielectric (layer) structure that is configured to be treated (shows an effect) using photo-imaging. In particular, the term refers to a PID dielectric layer structure into which a cavity can be formed using (only) photo-imaging techniques. Preferably, a PID layer structure comprises a non-fiber enforced resin, e.g., polyimide. A base material for a PID application may include: i) thermosetting material, e.g., epoxy, BCB, phenol, ii) thermoplastic material: PI, PBO. The PID material may further comprise a photo initiator (photo sensitive agent) that may be cured by photo UV light. The PID material may be laminated on a substrate (e.g., the stack) and may then be exposed to a lithographic source via a pattern mask, wherein the pattern mask defines the to be manufactured cavities. A portion of the PID material may be developed and one of an exposed portion and an unexposed portion (positive or negative photolithography may be used) may be removed to obtain a plurality of cavities. Examples of photolithography processes may include X-ray lithography, UV lithography, stereo lithography, e-beam lithography and laser lithography.

In the context of the present document, the term "component carrier" may particularly denote any support structure which is capable of accommodating one or more components thereon and/or therein for providing mechanical support and/or electrical connectivity. In other words, a component carrier may be configured as a mechanical and/or electronic carrier for components. In particular, a component carrier may be one of a printed circuit board, an organic interposer, a metal core substrate, an inorganic substrate and an IC (integrated circuit) substrate. A component carrier may also be a hybrid board combining different ones of the above-mentioned types of component carriers.

According to an exemplary embodiment, the disclosure may be based on the idea that a high magnetically enhanced inductance (value) for a component carrier can be provided in a cost-efficient manner, when a magnetic element with an embedded inductive element is assembled to the component carrier, wherein the magnetic element is surrounded by a dielectric (for example PID) layer structure of the component carrier. This specific design directly reflects a manufacturing method of providing a cavity in the dielectric layer structure, using e.g., one of photo-lithography, etching, or (core) pre-cutting, and placing the magnetic element into the cavity, so that the magnetic element is surrounded (embedded) by the dielectric material.

Preferably, the manufacturing process may be performed in two steps of dielectric layer structure lamination, wherein only a first (lower) part of the magnetic element is placed in a first cavity of a first dielectric layer structure, before a second cavity is formed in a second dielectric layer structure (above the first dielectric layer structure) to enable arranging a second (upper) part of the magnetic element on top of the first magnetic element. Such a two-step approach may enable embedding the inductive element (e.g., in form of a copper coil) in between the first magnetic element and the second magnetic element directly within the component carrier manufacturing process.

The inventors have now found that it may be surprisingly efficient to provide the magnetic material as a (planar oriented) magnetic element into a cavity formed in a dielectric layer structure of the component carrier. In particular, a higher inductance value can be provided, since a larger amount of magnetic material (and accordingly more and larger magnetic particles) may be embedded in component carrier material. Further, the (e.g., photo-lithography) process for forming the cavities in dielectric material may be easily and cost-efficiently realized also at a large scale.

The significantly improved inductance values may be in particular suitable for specific applications such as clients (processors), smartphones, wearables, and medical applications.

According to an embodiment, the magnetic element comprises a magnetic matrix, and an electrically conductive structure (e.g., a copper trace) that is (at least partially) (in particular fully) embedded in the magnetic matrix to provide the inductive element. Thereby, a planar inductive element may be provided in an efficient, robust, and cost-saving manner.

The magnetic matrix may encapsulate (fully) the electrically conductive structure and thus significantly increase the inductance value. Using a magnetic element (planar) within a cavity, a large amount of magnetic material may be applied (in comparison to coaxial inductors) which may lead to a higher inductance value.

According to a further embodiment, the electrically conductive structure is formed as a winding (in particular a coil-like structure). This may provide the advantage that an inductance may be easily provided merely by the form of the electrically conductive structure.

In the context of the present document, the term "winding" may particularly denote a loop structure (which may be similar to a helical structure with corners), wherein multiple of such loops may form a coil-type arrangement. However, due to the component carrier manufacturing technology (for instance involving lamination) of the magnetic element and/or due to the used component carrier raw materials (for instance involving planar constituents such as plates and foils), the windings of the coil (like) structure may have edge-like or corner-like portions rather than being limited to a composition of multiple interconnected purely circular structures.

According to a further embodiment, the directions of main extension (length x and width y) of the winding are (essentially) parallel to the directions of main extension (length x and width y) of the component carrier. In case that the magnetic element and the component carrier are plate-shaped (in particular planar), they may be oriented in parallel with respect to each other. This may provide the advantage of a high inductance value (see above) that can be provided in an easy manner.

It should be noted that the magnetic field of a horizontally (planar) oriented magnetic element may be perpendicular when compared with a magnetic field of a conventional coaxial winding (with respect to the component carrier).

According to a further embodiment, the dielectric layer structure comprises a shift pattern that reflects a manufacturing step of laminating a second dielectric layer structure on a first dielectric layer structure to form the dielectric layer structure (see also FIGS. 6H-6K below). This may provide the specific advantage that the inductive element may be efficiently enclosed in the magnetic matrix directly during the component carrier manufacturing (during layer build-up). As will be described below in detail, at least two dielectric layer structures (and two corresponding cavities) may be applied to embed the inductive element within the magnetic element. At the interface of the first dielectric layer structure and the second dielectric layer structure, the shift pattern may be observable visually or using a microscope.

According to a further embodiment, the shift pattern comprises at least one of the group which consists of an alignment shift, a smearing, a tapering of a dielectric layer structure sidewall being in contact with a sidewall of the magnetic element. Thus, in the finished component carrier product, the manufacturing process of providing at least two dielectric layer structures (to embed the magnetic element) is directly reflected.

According to a further embodiment, the shift pattern is established along a plane being (essentially) flush to an upper main surface of the electrically conductive structure and being (essentially) parallel to the directions of main extension (x, y) of the component carrier. Hence, in the finished component carrier product, the manufacturing process of providing at least two dielectric layer structures to embed the inductor element in the magnetic matrix directly within component carrier manufacturing, is reflected.

According to a further embodiment, a further shift pattern may be present at an interface between the first magnetic element and the second magnetic element, in particular along a plane being (essentially) flush to an upper main surface of the electrically conductive structure and being (essentially) parallel to the directions of main extension (x, y) of the component carrier.

According to a further embodiment, a lower main surface of the magnetic element is flush with an upper main surface of the layer stack. In this manner, the magnetic element can be directly applied on component carrier material.

According to a further embodiment, an upper main surface of the magnetic element is flush with an upper main surface of the dielectric layer structure. Thus, the magnetic element may perfectly fit in the (at least two) cavities and a further layer structure may be directly build-up on the component carrier.

According to a further embodiment the component carrier further comprises a further layer structure and/or a further stack arranged on the dielectric layer structure and/or on the magnetic element. This may provide the advantage that a further build-up can be done in an efficient and robust manner. In an example, the magnetic element may be sandwiched between several component carrier layers or between two or more layer stacks.

According to a further embodiment, the magnetic matrix continuously fills a volume around the electrically conductive structure and between windings of the electrically conductive structure (see, e.g., FIG. 3). This may provide the advantage that the electrically conductive structure is enclosed in a stable and robust manner. Further, this may provide the advantage that a high amount of magnetic material can be applied, and an accordingly high inductance can be achieved.

While conventionally only magnetic paste is arranged in small amounts around vias during component carrier manufacturing (which leads to low inductance values), the described (planar) magnetic element may allow for applying a high amount of magnetic matrix (that fills all the space between the vias).

According to a further embodiment, the magnetic matrix comprises at least one of the group consisting of a rigid solid, and a paste. Depending on the desired functionality, different configurations of the magnetic matrix may be especially suitable. For example, the magnetic matrix may be configured as a magnetic sheet (rigid) that can be laminated. In this example, the magnetic matrix may comprise a prepreg or another resin with embedded magnetic particles. In another example, the magnetic matrix may be configured as a magnetic paste (viscous) that could be filled/poured in a mold to manufacture the magnetic element.

According to a further embodiment, the magnetic matrix comprises one of the group which consists of: electrically conductive, electrically insulating, partially electrically conductive and partially electrically insulating (e.g., a first electrically conductive part and a second electrically insulating part). Depending on the desired functionality, different configurations of the magnetic matrix may be especially suitable.

According to a further embodiment, the relative magnetic permeability $\mu_r$ of the magnetic matrix is in a range from 2 to $10^6$, in particular 2 to 1000, more in particular 20 to 80, more in particular around 50. These values are comparably high and can lead to an advantageously high inductance value. Permeability is the measure of magnetization that a material obtains in response to an applied magnetic field. The relative permeability, denoted by the symbol $\mu_r$, is the ratio of the permeability of a specific medium $\mu$ to the permeability of free space $\mu_0$ (vacuum).

According to a further embodiment, the magnetic matrix comprises at least one material of the group consisting of a ferromagnetic material (e.g., iron, nickel), a ferrimagnetic material, a permanent magnetic material, a soft magnetic material, a ferrite, a metal oxide (e.g., magnetite), a dielectric matrix (e.g., a resin), in particular a prepreg, with magnetic particles therein, and an alloy, in particular an iron alloy or alloyed silicon. Thereby, established materials can be directly applied to manufacture the magnetic matrix in a cost-efficient manner.

A permanent magnetic material may be ferromagnetic material or ferrimagnetic material, and may for instance be provided on the basis of transition metals (with partially filled 3d shell) such as iron or nickel, or on the basis of rare earths (with partially filled 4f shell).

A soft magnetic material may be a material which can be easily re-magnetized, i.e., having a small area of its hysteresis curve. In other words, soft magnetic materials are those materials that are easily magnetized and demagnetized. They may have intrinsic coercivity less than 1000 $Am^{-1}$.

A ferrite may be denoted as a type of ceramic compound composed of $Fe_2O_3$ combined chemically with one or more additional metallic elements. Ferrites are both electrically non-conductive and ferrimagnetic, so they can be magnetized or attracted by a magnet. Ferrites may be implemented as hard ferrites or soft ferrites, depending on the application.

According to a further embodiment of the method, placing (e.g., by screen printing) the first magnetic element further comprises: providing a plurality of gaps within the first magnetic element, and arranging an electrically conductive structure at least partially in the gaps (in particular in form of windings), so that an inductive element is provided. Advantageously, embedding the inductive element is directly integrated within the component carrier manufacturing process. Providing the gaps may, e.g., include etching, mechanical drilling, or laser drilling. The gaps may be arranged in form of a winding to provide a mold for the electrically conductive structure. Said electrically conductive structure may be arranged by electroplating (e.g., copper) within the gaps, preferably in form of the windings.

According to a further embodiment of the method, arranging the electrically conductive structure further comprises providing a seed-layer (e.g., electro-less plating and/or sputtering) to cover a respective bottom of the plurality of gaps. Then, the filling the gaps may be (at least partially) (in particular fully) by electro-plating.

According to a further embodiment of the method, placing the second magnetic element further comprises: arranging the second magnetic element on (in particular directly on) the first magnetic element in order to embed the electrically conductive structure within magnetic material. Thereby, a robust and reliable magnetic element can be obtained directly within the component carrier manufacture.

According to a further embodiment of the method, the first magnetic element comprises a first magnetic matrix, the second magnetic element comprises a second magnetic matrix, and the first magnetic matrix and the second magnetic matrix comprise a similar material or a different material. In this manner, there are provided different design options depending on the desired application.

According to a further embodiment of the method, forming the second cavity further comprises: exposing an upper main surface of the first magnetic element. Hence, the upper main surface of the first magnetic element is directly operable and, for example, the second magnetic element can be connected directly.

According to a further embodiment of the method, arranging the first dielectric layer structure and/or the second dielectric layer structure comprises lamination using at least one of heat and pressure. This may provide the advantage that an established industry-relevant component carrier manufacturing technique can be directly applied.

According to a further embodiment of the method, the dielectric layer structure is a PID layer structure, and forming the first cavity and/or the second cavity comprises: exposing a part of the first PID layer structure and/or the second PID layer structure to photo-imaging, in particular photolithography. This may provide the advantage that an established industry-relevant component carrier manufacturing technique can be directly applied.

According to a further embodiment, forming the first cavity and/or the second cavity comprises removing a part of the first dielectric layer structure and/or the second dielectric layer structure by etching or (core) pre-cutting (e.g., mechanical or laser).

According to a further embodiment, the dielectric layer structure comprises a cavity, and the magnetic element is at least partially (in particular fully) embedded in the cavity.

According to a further embodiment of the method, placing the first magnetic element and/or the second magnetic element further comprises screen printing. This may provide the advantage that an established industry-relevant component carrier manufacturing technique can be directly applied.

In an embodiment, the magnetic element may be configured for shielding electromagnetic radiation from propagating within the component carrier or within the stack (for instance from a first portion of the stack to a second portion of the stack). The magnetic element may however also be configured for shielding electromagnetic radiation from propagating between component carrier and an environment. Such a shielding may include a prevention of electromagnetic radiation from propagating from an exterior of the component carrier to an interior of the component carrier, from an interior of the component carrier to an exterior of the component carrier, and/or between different portions of the component carrier. In particular, such a shielding may be accomplished in a lateral direction of the stack (i.e., horizontally) and/or in a stacking direction of the stack (i.e., vertically). In such an embodiment, the magnetic element may function for shielding electromagnetic radiation to thereby suppress undesired effects of electromagnetic interference (EMI), in particular in the radio-frequency (RF) regime.

In a further embodiment, the component carrier comprises at least one via that extends through the layer stack and/or through the dielectric (PID) layer structure. In further embodiment, the via may extend through the magnetic element. Thus, an efficient and (design) flexible electric connection may be enabled.

In the context of the present document, the term "via" (vertical interconnection access) may refer to an electrical connection between layers in a physical electronic circuit that goes through the plane of one or more adjacent layers. The term via may include through-hole vias, buried vias, and blind vias. While vias may be used to connect only a few layers (in a stack) with each other, a "plated through hole" may be used to connect all layers of a stack. Microvias are used as interconnects between layers in high density interconnect (HDI) substrates and printed circuit boards (PCBs) to accommodate the high I/O density of advanced packages. In the present document, an electrically conductive through connection may be called a via.

In an embodiment, the component carrier comprises a stack of at least one electrically insulating layer structure and at least one electrically conductive layer structure. For example, the component carrier may be a laminate of the mentioned electrically insulating layer structure(s) and electrically conductive layer structure(s), in particular formed by applying mechanical pressure and/or thermal energy. The mentioned stack may provide a plate-shaped component carrier capable of providing a large mounting surface for further components and being nevertheless very thin and compact. The term "layer structure" may particularly denote a continuous layer, a patterned layer or a plurality of non-consecutive islands within a common plane.

In an embodiment, the component carrier is shaped as a plate. This contributes to the compact design, wherein the component carrier nevertheless provides a large basis for mounting components thereon. Furthermore, in particular a bare die as example for an embedded electronic component, can be conveniently embedded, thanks to its small thickness, into a thin plate such as a printed circuit board.

In an embodiment, the component carrier is configured as one of the group consisting of a printed circuit board, a substrate (in particular an IC substrate), and an interposer.

In the context of the present application, the term "printed circuit board" (PCB) may particularly denote a plate-shaped component carrier which is formed by laminating several electrically conductive layer structures with several electrically insulating layer structures, for instance by applying pressure and/or by the supply of thermal energy. As preferred materials for PCB technology, the electrically conductive layer structures are made of copper, whereas the electrically insulating layer structures may comprise resin and/or glass fibers, so-called prepreg or FR4 material. The various electrically conductive layer structures may be connected to one another in a desired way by forming holes through the laminate, for instance by laser drilling or mechanical drilling, and by partially or fully filling them with electrically conductive material (in particular copper), thereby forming vias or any other through-hole connections. The filled hole either connects the whole stack, (through-hole connections extending through several layers or the entire stack), or the filled hole connects at least two electrically conductive layers, called via. Similarly, optical interconnections can be formed through individual layers of the stack in order to receive an electro-optical circuit board (EOCB). Apart from one or more components which may be embedded in a printed circuit board, a printed circuit board is usually configured for accommodating one or more components on one or both opposing surfaces of the plate-shaped printed circuit board. They may be connected to the respective main surface by soldering. A dielectric part of a PCB may be composed of resin with reinforcing fibers (such as glass fibers).

In the context of the present application, the term "substrate" may particularly denote a small component carrier. A substrate may be a, in relation to a PCB, comparably small component carrier onto which one or more components may be mounted and that may act as a connection medium between one or more chip(s) and a further PCB. For instance, a substrate may have substantially the same size as a component (in particular an electronic component) to be mounted thereon (for instance in case of a Chip Scale Package (CSP)). More specifically, a substrate can be understood as a carrier for electrical connections or electrical networks as well as component carrier comparable to a printed circuit board (PCB), however with a considerably higher density of laterally and/or vertically arranged connections. Lateral connections are for example conductive paths, whereas vertical connections may be for example drill holes. These lateral and/or vertical connections are arranged within the substrate and can be used to provide electrical, thermal and/or mechanical connections of housed components or unhoused components (such as bare dies), particularly of IC chips, with a printed circuit board or intermediate printed circuit board. Thus, the term "substrate" also includes "IC substrates". A dielectric part of a substrate may be composed of resin with reinforcing particles (such as reinforcing spheres, in particular glass spheres).

The substrate or interposer may comprise or consist of at least a layer of glass, silicon (Si) and/or a photoimageable or dry-etchable organic material like epoxy-based build-up material (such as epoxy-based build-up film) or polymer compounds (which may or may not include photo- and/or thermosensitive molecules) like polyimide or polybenzoxazole.

In an embodiment, the at least one electrically insulating layer structure comprises at least one of the group consisting of a resin or a polymer, such as epoxy resin, cyanate ester resin, benzocyclobutene resin, bismaleimide-triazine resin, polyphenylene derivate (e.g. based on polyphenylenether, PPE), polyimide (PI), polyamide (PA), liquid crystal polymer (LCP), polytetrafluoroethylene (PTFE) and/or a combination thereof. Reinforcing structures such as webs, fibers, spheres or other kinds of filler particles, for example made of glass (multilayer glass) in order to form a composite, could be used as well. A semi-cured resin in combination with a reinforcing agent, e.g., fibers impregnated with the above-mentioned resins is called prepreg. These prepregs are often named after their properties, e.g., FR4 or FR5, which describe their flame retardant properties. Although prepreg particularly FR4 are usually preferred for rigid PCBs, other materials, in particular epoxy-based build-up materials (such as build-up films) or photoimageable dielectric materials, may be used as well. For high frequency applications, high-frequency materials such as polytetrafluoroethylene, liquid crystal polymer and/or cyanate ester resins, may be preferred. Besides these polymers, low temperature cofired ceramics (LTCC) or other low, very low or ultra-low DK materials may be applied in the component carrier as electrically insulating structures.

In an embodiment, the at least one electrically conductive layer structure comprises at least one of the group consisting of copper, aluminum, nickel, silver, gold, palladium, tungsten and magnesium. Although copper is usually preferred, other materials or coated versions thereof are possible as well, in particular coated with supra-conductive material or conductive polymers, such as graphene or poly(3,4-ethylenedioxythiophene) (PEDOT), respectively.

At least one component may be embedded in the component carrier and/or may be surface mounted on the component carrier. Such a component can be selected from a group consisting of an electrically non-conductive inlay, an electrically conductive inlay (such as a metal inlay, preferably comprising copper or aluminum), a heat transfer unit (for example a heat pipe), a light guiding element (for example an optical waveguide or a light conductor connection), an electronic component, or combinations thereof. An inlay can be for instance a metal block, with or without an insulating material coating (IMS-inlay), which could be either embedded or surface mounted for the purpose of facilitating heat dissipation. Suitable materials are defined according to their thermal conductivity, which should be at least 2 W/mK. Such materials are often based, but not limited to metals, metal-oxides and/or ceramics as for instance copper, aluminum oxide ($Al_2O_3$) or aluminum nitride (AlN). In order to increase the heat exchange capacity, other geometries with increased surface area are frequently used as well. Furthermore, a component can be an active electronic component (having at least one p-n-junction implemented), a passive electronic component such as a resistor, an inductance, or capacitor, an electronic chip, a storage device (for instance a DRAM or another data memory), a filter, an integrated circuit (such as field-programmable gate array (FPGA), programmable array logic (PAL), generic array logic (GAL) and complex programmable logic devices (CPLDs)), a signal processing component, a power management component (such as a field-effect transistor (FET), metal-oxide-semiconductor field-effect transistor (MOSFET), complementary metal-oxide-semiconductor (CMOS), junction field-effect transistor (JFET), or insulated-gate field-effect transistor (IGFET), all based on semi-conductor materials such as silicon carbide (SiC), gallium arsenide (GaAs), gallium nitride (GaN), gallium oxide ($Ga_2O3$), indium gallium arsenide (InGaAs) and/or any other suitable inorganic compound), an optoelectronic interface element, a light emitting diode, a photocoupler, a voltage converter (for example a DC/DC converter or an AC/DC converter), a cryptographic component, a transmitter and/or receiver, an electromechanical transducer, a sensor, an actuator, a microelectromechanical system (MEMS), a microprocessor, a capacitor, a resistor, an inductance, a battery, a switch, a camera, an antenna, a logic chip, and an energy harvesting unit. However, other components may be embedded in the component carrier. For example, a magnetic element can be used as a component. Such a magnetic element may be a permanent magnetic element (such as a ferromagnetic element, an antiferromagnetic element, a multiferroic element or a ferrimagnetic element, for instance a ferrite core) or may be a paramagnetic element. However, the component may also be an IC substrate, an interposer or a further component carrier, for example in a board-in-board configuration. The component may be surface mounted on the component carrier and/or may be embedded in an interior thereof. Moreover, also other components, in particular those which generate and emit electromagnetic radiation and/or are sensitive with regard to electromagnetic radiation propagating from an environment, may be used as component.

In an embodiment, the component carrier is a laminate-type component carrier. In such an embodiment, the component carrier is a compound of multiple layer structures which are stacked and connected together by applying a pressing force and/or heat.

After processing interior layer structures of the component carrier, it is possible to cover (in particular by lamination) one or both opposing main surfaces of the processed layer structures symmetrically or asymmetrically with one or more further electrically insulating layer structures and/or electrically conductive layer structures. In other words, a build-up may be continued until a desired number of layers is obtained.

After having completed formation of a stack of electrically insulating layer structures and electrically conductive layer structures, it is possible to proceed with a surface treatment of the obtained layers structures or component carrier.

In particular, an electrically insulating solder resist may be applied to one or both opposing main surfaces of the layer stack or component carrier in terms of surface treatment. For instance, it is possible to form such a solder resist on an entire main surface and to subsequently pattern the layer of solder resist so as to expose one or more electrically conductive surface portions which shall be used for electrically coupling the component carrier to an electronic periphery. The surface portions of the component carrier remaining covered with solder resist may be efficiently protected against oxidation or corrosion, in particular surface portions containing copper.

It is also possible to apply a surface finish selectively to exposed electrically conductive surface portions of the component carrier in terms of surface treatment. Such a surface finish may be an electrically conductive cover material on exposed electrically conductive layer structures (such as pads, conductive tracks, etc., in particular comprising or consisting of copper) on a surface of a component carrier. If such exposed electrically conductive layer structures are left unprotected, then the exposed electrically conductive component carrier material (in particular copper) might oxidize, making the component carrier less reliable. A surface finish may then be formed for instance as an interface between a surface mounted component and the component carrier. The surface finish has the function to protect the exposed electrically conductive layer structures (in particular copper circuitry) and enable a joining process with one or more components, for instance by soldering. Examples for appropriate materials for a surface finish are Organic Solderability Preservative (OSP), Electroless Nickel Immersion Gold (ENIG), Electroless Nickel Immersion Palladium Immersion Gold (ENIPIG), gold (in particular hard gold), chemical tin, nickel-gold, nickel-palladium, etc.

The aspects defined above and further aspects of the disclosure are apparent from the examples of embodiment to be described hereinafter and are explained with reference to these examples of embodiment.

BRIEF DESCRIPTION OF THE DRAWINGS

FIG. 5A, FIG. 5B, FIG. 5C, FIG. 5D, FIG. 5E, FIG. 5F, FIG. 5G to FIG. 5H illustrate a first part of a method of manufacturing the component carrier according to an exemplary embodiment of the disclosure.

FIG. 6A, FIG. 6B, FIG. 6C, FIG. 6D, FIG. 6E, FIG. 6F, FIG. 6G, FIG. 6H, FIG. 6I, FIG. 6J, FIG. 6K to FIG. 6L illustrate a second part of a method of manufacturing the component carrier according to an exemplary embodiment of the disclosure.

DETAILED DESCRIPTION OF ILLUSTRATED EMBODIMENTS

Figure 1:
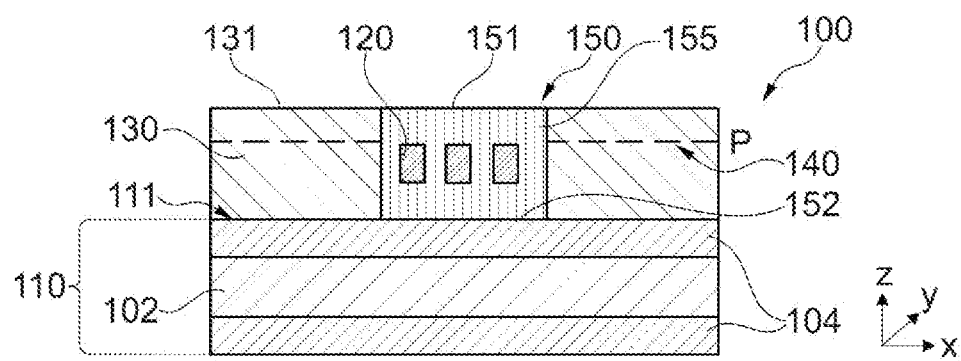
FIG. 1 shows a side view of a component carrier with an embedded magnetic element according to an exemplary embodiment of the disclosure.

The illustrations in the drawings are schematically presented. In different drawings, similar or identical elements are provided with the same reference signs.

Before, referring to the drawings, exemplary embodiments will be described in further detail, some basic considerations will be summarized based on which exemplary embodiments of the disclosure have been developed.

According to an exemplary embodiment, large cavities are formed inside a photo-imageable dielectric layer which can be filled with magnetic paste. The cavity can be round, rectangular or any other shape depending on the application needed. Further, the cavity can be created by photolithography which avoids the expensive process of laser cutting of the core or time-consuming mechanical drilling (e.g., several hundreds of thousands of drills on one panel). Alternatively, cavities can be formed by etching or pre-cutting, whereby costs may be saved.

According to an exemplary embodiment, by stacking several PID layers, a cavity with higher thickness can be created which allows: more magnetic material printed inside the cavity thus achieving higher inductance values, and mechanical drilling can be eliminated which enables cost saving.

FIG. 1 shows a side view of a component carrier 100 with an embedded magnetic element according to an exemplary embodiment of the disclosure. The component carrier 100 comprises a stack 110 (e.g., a copper-clad laminate or a multilayer stack) comprising electrically conductive layer structures 104 and an electrically insulating layer structure 102 (e.g., a core layer).

A magnetic element 150 is surface mounted (assembled) to the stack 110 and comprises an embedded inductive element 120. The lower main surface 152 of the magnetic element 150 is directly placed on the stack 110 and is thus flush with the upper main surface 111 of the stack 110. The magnetic element 150 comprises a magnetic matrix 155 (a magnetic paste) and an electrically conductive structure 120 that is fully embedded in the magnetic matrix 155. The electrically conductive structure 120 comprises windings and thereby serves as the embedded inductive element 120. The magnetic element 150 has a planar shape (wherein the extension in z-direction is lower than the extension in x- and y-direction), so that the windings are arranged in a horizontal direction of the component carrier 100.

The component carrier 100 further comprises a dielectric layer structure 130, for example a photo-imageable dielectric (PID) layer structure 130 on the stack 110. Base materials for a PID application can include: i) thermosetting material: epoxy, BCB, phenol, ii) thermoplastic material: PI, PBO, and can comprise a photo initiator (photo sensitive agent) to be able to be cured by photo UV light.

The magnetic element 150 is embedded in the PID layer structure 130, so that the PID layer structure 130 fully surrounds the sidewalls of the magnetic element 150. The upper main surface 151 of the magnetic element 150 is flush with the upper main surface 131 of the PID layer structure 130 and is thus exposed. A further layer structure and/or a further stack can be arranged on the PID layer structure 130 (not shown).

The PID layer structure 130 comprises a shift pattern 140 that reflects a manufacturing step of laminating a second PID layer structure 130b on a first PID layer structure 130a to form the PID layer structure 130 (see FIG. 6). Said shift pattern 140 is established along a plane P being flush to the upper main surface 121 of the electrically conductive structure 120 and being parallel to the directions of main extension x, y of the component carrier 100.

Hereby, the shift pattern 140 comprises for example an alignment shift.

Figure 2:
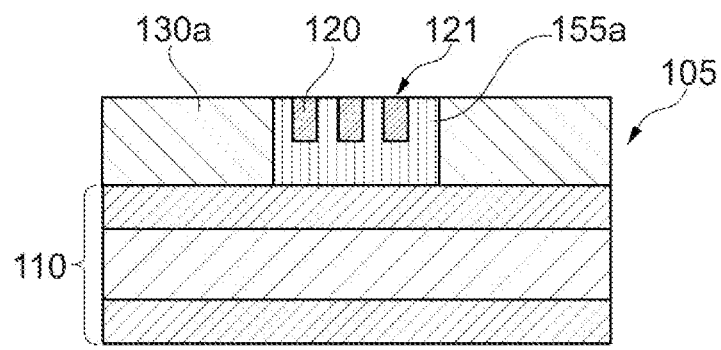
FIG. 2 shows a side view of a semi-finished component carrier with an embedded magnetic element according to a further exemplary embodiment of the disclosure.

FIG. 2 shows a side view of a semi-finished component carrier 105 with an embedded magnetic element 150 according to a further exemplary embodiment of the disclosure. The device 105 shown in FIG. 2 is very similar to the one described in FIG. 1 with the difference that the electrically conductive structure 120 is embedded in a first part of the magnetic matrix 155a, so that the sidewalls of the electrically conductive structure 120 are surrounded by the magnetic matrix 155a. However, an upper surface 121 of the electrically conductive structure 120 is still exposed. The first part of the magnetic matrix 155a is surrounded by a first part of the dielectric layer structure 130a. The semi-finished product 105 is obtained at the process step shown in FIG. 6G (see below).

Figure 3:
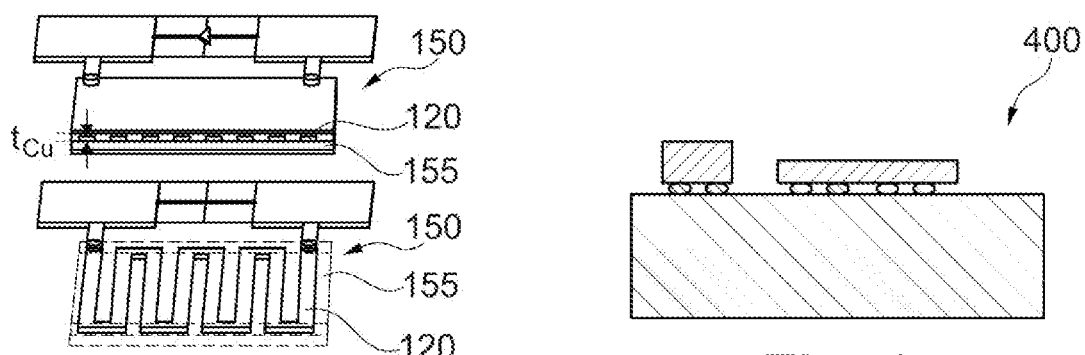
FIG. 3 shows a detailed view of a magnetic element that comprises an inductive element in a magnetic matrix according to an exemplary embodiment of the disclosure.
Figure 4:
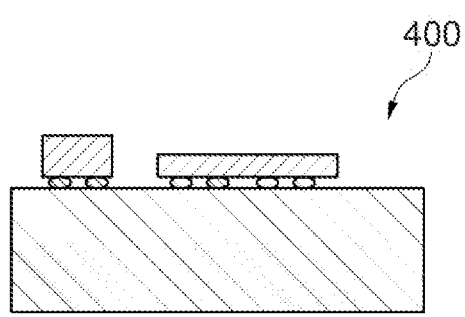
FIG. 4 shows an example of a conventional circuit board with surface-mounted magnetic material.

FIG. 3 shows a detailed view of a magnetic element 150 that comprises an inductive element 120 embedded in a magnetic matrix 155 according to an exemplary embodiment of the disclosure. It can be seen that the inductive element 120 is formed by an electrically conductive structure 120 (e.g., copper) winding that is formed in a coil-like manner. A starting point and an end point of the winding 120 are respectively electrically connected to a terminal. When an electric current is provided to the winding 120, an inductance is provided which is in turn amplified by the magnetic matrix 150. Since the magnetic element 150 comprises a planar shape, the electrically conductive structure 120 is oriented horizontally with respect to the component carrier 100. By providing the magnetic matrix 155, a large amount of magnetic material (e.g., in comparison to prior art example in FIG. 4) can be applied. As a consequence, a high inductance value can be obtained.

FIGS. 5A to 5H illustrate a first part of a method of manufacturing the component carrier 100 according to an exemplary embodiment of the disclosure.

As illustrated in FIG. 5A a layer stack 101 is provided with a first dielectric layer structure 130a on top that is further covered by a film layer 160 (e.g., a PET film). The dielectric layer structure in this example comprises a photo-imageable dielectric (PID).

As shown in FIG. 5B, photolithography (shown by arrows) is applied, wherein a first portion of the first dielectric layer structure 130a is covered by a mask (or LDI) 161, while a second portion of the first dielectric layer structure 130a is exposed. Instead of a mask, laser direct imaging (LDI) can be applied to cure the sections that need to be cured/structured (since there may be a need to structure the dielectric layer structure 130.

As illustrated in FIG. 5C, the exposed portion has been removed in order to obtain a first cavity 135a. Further the film layer 160 has been removed.

In optional process steps shown in FIGS. 5D-5F, the first cavity 135a (i.e., the sidewalls of the cavity) are further enlarged by repeating the process described in FIGS. 5A-5C.

As shown in FIGS. 5G and 5H, after developing and curing of the dielectric material, a robust first cavity 135a is provided in the first dielectric layer structure 130a.

FIGS. 6A to 6L illustrate a second part of a method of manufacturing the component carrier 100 according to an exemplary embodiment of the disclosure. The second method can directly build up on the first method and start with the product obtained in FIG. 5H.

As shown in FIG. 6A, a first magnetic element 150a is provided in form of a magnetic paste that is filled (poured) into the first cavity 135a by screen printing 163. Such a cavity can be formed by photo-imaging (when the dielectric layer structure 130 is a PID layer structure), etching, or by pre-cutting. Thus, a first magnetic element 150a is placed into the first cavity 135a, so that the first dielectric layer structure 130a surrounds the first magnetic element 150a.

As shown in FIG. 6B, the stencil (for screen printing) 163 is removed and a first curing step is performed.

As illustrated in FIG. 6C, overlapping magnetic material of the first magnetic element 150a is removed by grinding. A second curing step is performed.

As shown in FIG. 6D, a plurality of gaps 156 are provided within the first magnetic element 150a (e.g., "laser trenching").

As illustrated in FIG. 6E, a seed-layer 164 is provided (e.g., using electroless-plating and/or sputtering) to cover respective bottoms of the plurality of gaps 156 and the upper main surface of the first dielectric layer structure 130a.

As shown in FIG. 6F, the gaps 156 are filled by electroplating 165, in particular with copper. The metal layer 165 on top of the upper main surface of the first part of the dielectric layer structure 130a is increased. Thereby, an electrically conductive structure 120 is formed in the gaps 156 in form of windings, so that an inductive element is provided.

As illustrated in FIG. 6G, said metal layer 165 is removed chemically or mechanically (planarization) and the semi-finished product 105 described in FIG. 2 is obtained.

As shown in FIG. 6H, a second dielectric layer structure 130b is arranged (laminated) on the first PID layer structure 130a and the first magnetic element 150a.

As illustrated in FIG. 6I, a second cavity 135b is formed within the second dielectric layer structure 130b as described for FIGS. 5A-C.

As depicted in FIG. 6J, after film layer removal, developing and curing the second dielectric layer structure 130b is performed. The second dielectric layer structure 130b has a tapered sidewall extending above the first dielectric layer structure 130a. The second cavity 135b is now arranged on top of the first magnetic element 150a and the embedded electrically conductive structure 120, whereby an upper main surface 151a of the first magnetic element 150a is exposed.

As illustrated in FIG. 6K, a second magnetic element 150b is placed into the second cavity 135b (by screen printing), so that the second dielectric layer structure 130b surrounds the second magnetic element 150b. The second magnetic element 150b is placed directly on the first magnetic element 150a in order to embed the electrically conductive structure 120 within magnetic material.

As shown in FIG. 6L, after removing of the stencil 163 that covers the dielectric layer structure 130, the following steps are performed: first curing, grinding, second curing. Then, the component carrier 100 described for FIG. 1 is obtained.

It should be noted that the term "comprising" does not exclude other elements or steps and the use of articles "a" or "an" does not exclude a plurality. Also, elements described in association with different embodiments may be combined.

Implementation of the invention is not limited to the preferred embodiments shown in the figures and described above. Instead, a multiplicity of variants is possible which variants use the solutions shown and the principle according to the invention even in the case of fundamentally different embodiments.

REFERENCE SIGNS

100 Component carrier
102 Electrically insulating layer structure
104 Electrically conductive layer structure
105 Semi-finished component carrier
110 Layer stack
111 Upper main surface layer stack
120 Electrically conductive structure, inductive element
121 Upper main surface electrically conductive structure
130 Dielectric (PID) layer structure
130a First part of dielectric layer structure
130b Second part of dielectric layer structure
131 Upper main surface dielectric layer structure
135a First cavity
135b Second cavity
140 Shift pattern
150 Magnetic element
150a First (part of) magnetic element
150b Second (part of) magnetic element
151 Upper main surface magnetic element
152 Lower main surface magnetic element
155 Magnetic matrix
155a First magnetic matrix
155b Second magnetic matrix
156 Gap
160 Film layer
161 Photo-mask
163 Stencil (screen printing)
164 Seed layer
165 Further conductive material
P Plane
400 Conventional circuit board

The invention claimed is:

1. A component carrier, comprising:
a stack including at least one electrically conductive layer structure and at least one electrically insulating layer structure;
a magnetic element assembled to the stack, the magnetic element including an embedded inductive element; and
a dielectric layer structure on the stack, the dielectric layer structure at least partially surrounding the magnetic element,
wherein a first main surface of the magnetic element is flush with a respective first main surface of the dielectric layer structure,
wherein an opposed main surface of the magnetic element contacts a respective opposed main surface of the stack,
wherein the magnetic element includes a plurality of gaps,
wherein the embedded inductive element is in the gaps,
wherein the magnetic element comprises:
a magnetic matrix, and
wherein the embedded inductive element is an electrically conductive structure that is at least partially embedded in the magnetic matrix,
wherein the dielectric layer structure comprises a shift pattern at an interface between a first dielectric layer structure and a second dielectric layer structure,
wherein the shift pattern comprises at least one of the group which consists of an alignment shift, a smearing, a tapering of a dielectric layer structure sidewall being in contact with a sidewall of the magnetic element,
wherein the magnetic element comprises a first magnetic element and a second magnetic element,
wherein the second magnetic element is placed directly on the first magnetic element,
wherein the first dielectric layer structure at least partially surrounds the first magnetic element, and the second dielectric layer structure at least partially surrounds the second magnetic element.

2. The component carrier according to claim 1,
wherein the electrically conductive structure is formed as a winding, and
wherein the directions of main extension of the winding are essentially parallel to the directions of main direction of the component carrier.

3. The component carrier according to claim 1,
wherein the shift pattern is established along a plane being essentially flush to an upper main surface of the electrically conductive structure and parallel to the directions of main extension of the component carrier.

4. The component carrier according to claim 1,
wherein the dielectric layer structure comprises a cavity, and wherein the magnetic element is at least partially embedded in the cavity.

5. The component carrier according to claim 1,
wherein the dielectric layer structure is a photo-imageable dielectric.

6. The component carrier according to claim 1, comprising at least one of the following features:
wherein a lower main surface of the magnetic element is flush with an upper main surface of the stack;
wherein the component carrier further comprises:
a further layer structure and/or a further stack arranged on the dielectric layer structure and/or on the magnetic element.

7. The component carrier according to claim 1, wherein the magnetic matrix comprises at least one of the following features:
wherein the magnetic matrix continuously fills a volume around the electrically conductive structure and between windings of the electrically conductive structure;
wherein the magnetic matrix comprises at least one of the group consisting of a rigid solid, and a paste;
wherein the magnetic matrix comprises one of the group which consists of:
electrically conductive, electrically insulating, partially electrically conductive and partially electrically insulating;
wherein the relative magnetic permeability $\mu_r$ of the magnetic matrix is in a range from 2 to $10^6$;
wherein the magnetic matrix comprises at least one material of the group consisting of a ferromagnetic material, a ferrimagnetic material, a permanent magnetic material, a soft magnetic material, a ferrite, a metal oxide, a dielectric matrix, a prepreg, with magnetic particles therein, and an alloy or alloyed silicon.

8. A method, comprising:
using photolithography to provide cavities in a dielectric layer structure of a component carrier, the component carrier having a stack with at least one electrically conductive layer structure and at least one electrically insulating layer structure;
embedding a magnetic element in the component carrier, and
arranging an electrically conductive structure that is at least partially embedded in the magnetic matrix,
wherein an upper main surface of the magnetic element is flush with an upper main surface of the dielectric layer structure,
wherein the dielectric layer structure at least partially surrounds the magnetic element;
wherein the magnetic element comprises a plurality of gaps within the magnetic element,
wherein the electrically conductive structure is in the gaps,
wherein a lower main surface of the magnetic element contacts an upper main surface of the stack,
wherein the dielectric layer structure comprises a shift pattern at an interface between a first dielectric layer structure and a second dielectric layer structure,
wherein the shift pattern comprises at least one of the group which consists of an alignment shift, a smearing, a tapering of a dielectric layer structure sidewall being in contact with a sidewall of the magnetic element,
wherein the magnetic element comprises a first magnetic element and a second magnetic element,
wherein the second magnetic element is placed directly on the first magnetic element,
wherein the first dielectric layer structure at least partially surrounds the first magnetic element, and the second dielectric layer structure at least partially surrounds the second magnetic element,
wherein a seed layer is provided to cover the respective bottoms of the plurality of gaps and an inductive element is provided by the electrically conductive structure which is formed in the gaps by electroplating.

* * * * *